United States Patent
Tseng et al.

(10) Patent No.: US 10,623,011 B2
(45) Date of Patent: Apr. 14, 2020

(54) SUCCESSIVE APPROXIMATION ANALOG-TO-DIGITAL CONVERTER AND CALIBRATION METHOD THEREOF

(71) Applicant: Nuvoton Technology Corporation, Hsinchu (TW)

(72) Inventors: Hua-Chun Tseng, Jhubei (TW); Tu-Hsiu Wang, New Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/403,503

(22) Filed: May 4, 2019

(65) Prior Publication Data
US 2019/0393887 A1 Dec. 26, 2019

(30) Foreign Application Priority Data
Jun. 20, 2018 (TW) .............................. 107121119 A

(51) Int. Cl.
*H03M 1/10* (2006.01)
*H03M 1/46* (2006.01)
*H03M 1/12* (2006.01)

(52) U.S. Cl.
CPC ............ *H03M 1/46* (2013.01); *H03M 1/1038* (2013.01); *H03M 1/125* (2013.01)

(58) Field of Classification Search
CPC ...... H03M 1/46; H03M 1/1038; H03M 1/125; H03M 1/12; H03M 1/10; H03M 1/1009; H03M 2201/63; H03M 3/38; H03M 1/00
(Continued)

(56) References Cited

U.S. PATENT DOCUMENTS

| | | | | | |
|---|---|---|---|---|---|
| 8,786,483 | B1 * | 7/2014 | Thompson | .......... | H03M 1/0836 341/120 |
| 8,907,834 | B2 * | 12/2014 | Lee | .................... | H03M 1/1009 341/120 |

(Continued)

FOREIGN PATENT DOCUMENTS

| CN | 107241098 A | 10/2017 |
|---|---|---|
| CN | 104242934 B | 12/2017 |

(Continued)

*Primary Examiner* — Jean B Jeanglaude
(74) *Attorney, Agent, or Firm* — Muncy, Geissler, Olds & Lowe, P.C.

(57) ABSTRACT

A successive-approximation-register (SAR) analog-to-digital converter (ADC) includes an analog circuit and a digital control circuit. The digital control circuit is coupled to the analog circuit. The digital control circuit includes a calibration circuit, a memory device, and an asynchronous control circuit. The calibration circuit is configured to perform a calibration operation. The memory device is coupled to the calibration circuit and stores calibration information generated by performing the calibration operation. The asynchronous control circuit is coupled to the memory device, and reads the calibration information from the memory device in an asynchronous control mode. In the asynchronous control mode, before the asynchronous control circuit performs the operations of the SAR ADC, the asynchronous control circuit removes the non-idea effects of the SAR ADC according to the calibration information.

15 Claims, 3 Drawing Sheets

(58) Field of Classification Search
USPC .................................... 341/120, 155, 161
See application file for complete search history.

(56) References Cited

U.S. PATENT DOCUMENTS

| | | | |
|---|---|---|---|
| 9,048,860 B1* | 6/2015 | Quinn | ................. H03M 1/46 |
| 9,306,591 B2 | 4/2016 | Khoshgard et al. | |
| 9,484,945 B1 | 11/2016 | Wan et al. | |
| 9,521,337 B1 | 12/2016 | Shen et al. | |
| 9,608,652 B2* | 3/2017 | Lee | ................. H03M 1/002 |
| 9,871,529 B1 | 1/2018 | Chong et al. | |

FOREIGN PATENT DOCUMENTS

| | | | |
|---|---|---|---|
| TW | 200910772 A | 3/2009 | |
| TW | I443969 B | 7/2014 | |
| TW | I470939 B | 1/2015 | |
| TW | I577137 B | 4/2017 | |

* cited by examiner

SUCCESSIVE APPROXIMATION ANALOG-TO-DIGITAL CONVERTER AND CALIBRATION METHOD THEREOF

CROSS REFERENCE TO RELATED APPLICATIONS

This Application claims priority of TW Patent Application No. 107121119 filed on Jun. 20, 2018, the entirety of which is incorporated by reference herein.

BACKGROUND OF THE INVENTION

Field of the Invention

The invention generally relates to a calibration technology for a successive-approximation-register (SAR) analog-to-digital converter (ADC), and more particularly, to a calibration technology for a SAR ADC in which a synchronous control circuit and an asynchronous control circuit are integrated.

Description of the Related Art

In a traditional synchronous SAR ADC, before the SAR ADC is applied, a calibration for the synchronous SAR ADC may be performed by the synchronous SAR ADC itself to avoid errors being generated due to the non-idea effects of the synchronous SAR ADC. Due to the requirement for high-speed, high-performance, and low-power SAR ADCs, an asynchronous SAR ADC was developed.

However, although the asynchronous SAR ADC has the aforementioned advantages (e.g. high speed, high performance and low power), the asynchronous SAR ADC cannot calibrate by itself. As a result, when the asynchronous SAR ADC is used, worse product characteristics and a lower yield rate may result from the non-idea effects.

BRIEF SUMMARY OF THE INVENTION

The invention provides a successive-approximation-register (SAR) analog-to-digital converter (ADC) and a calibration method to overcome the problems described above.

An embodiment of the invention provides a SAR ADC. The SAR ADC comprises an analog circuit and a digital control circuit. The digital control circuit is coupled to the analog circuit. The digital control circuit comprises a calibration circuit, a memory device, and an asynchronous control circuit. The calibration circuit is configured to perform a calibration operation. The memory device is coupled to the calibration circuit and stores calibration information generated by performing the calibration operation. The asynchronous control circuit is coupled to the memory device, and reads the calibration information from the memory device in an asynchronous control mode. In the asynchronous control mode, before the asynchronous control circuit performs the operations of the SAR ADC, the asynchronous control circuit removes the non-idea effects of the SAR ADC according to the calibration information.

In some embodiments of the invention, the digital control circuit further comprises a selection circuit. The selection circuit is coupled to the calibration circuit and the asynchronous control circuit. The selection circuit selects the calibration circuit or the asynchronous control circuit to perform the operations of the SAR ADC according to a control signal. In some embodiments of the invention, the selection circuit receives the control signal from a control pin. In some embodiments of the invention, before the calibration operation is performed, the selection circuit selects the calibration circuit to calibrate the SAR ADC to generate the calibration information.

In some embodiments of the invention, the calibration circuit is a synchronous control circuit. When the synchronous control circuit is selected, the SAR ADC is operated in a synchronous mode. When the asynchronous control circuit is selected, the SAR ADC is operated in an asynchronous mode.

In some embodiments of the invention, the analog circuit comprises a sample and hold (S/H) circuit, a digital-to-analog convertor (DAC) and a comparator. The S/H circuit is coupled to the digital control circuit. The DAC is coupled to the digital control circuit. The comparator is coupled to the S/H circuit and the DAC.

An embodiment of the invention provides a calibration method. The calibration method is applied to a SAR ADC. The calibration method comprises the steps of performing a calibration operation by a calibration circuit of the SAR ADC; storing calibration information generated by performing the calibration operation; selecting an asynchronous control circuit to perform operations of the SAR ADC in an asynchronous control mode; removing the non-ideal effects of the SAR ADC according to the calibration information by the asynchronous control circuit; and performing the operations of the SAR ADC in the asynchronous control mode through the asynchronous control circuit.

Other aspects and features of the invention will become apparent to those with ordinary skill in the art upon review of the following descriptions of specific embodiments of the SAR ADC and calibration method.

BRIEF DESCRIPTION OF THE DRAWINGS

The invention will be more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
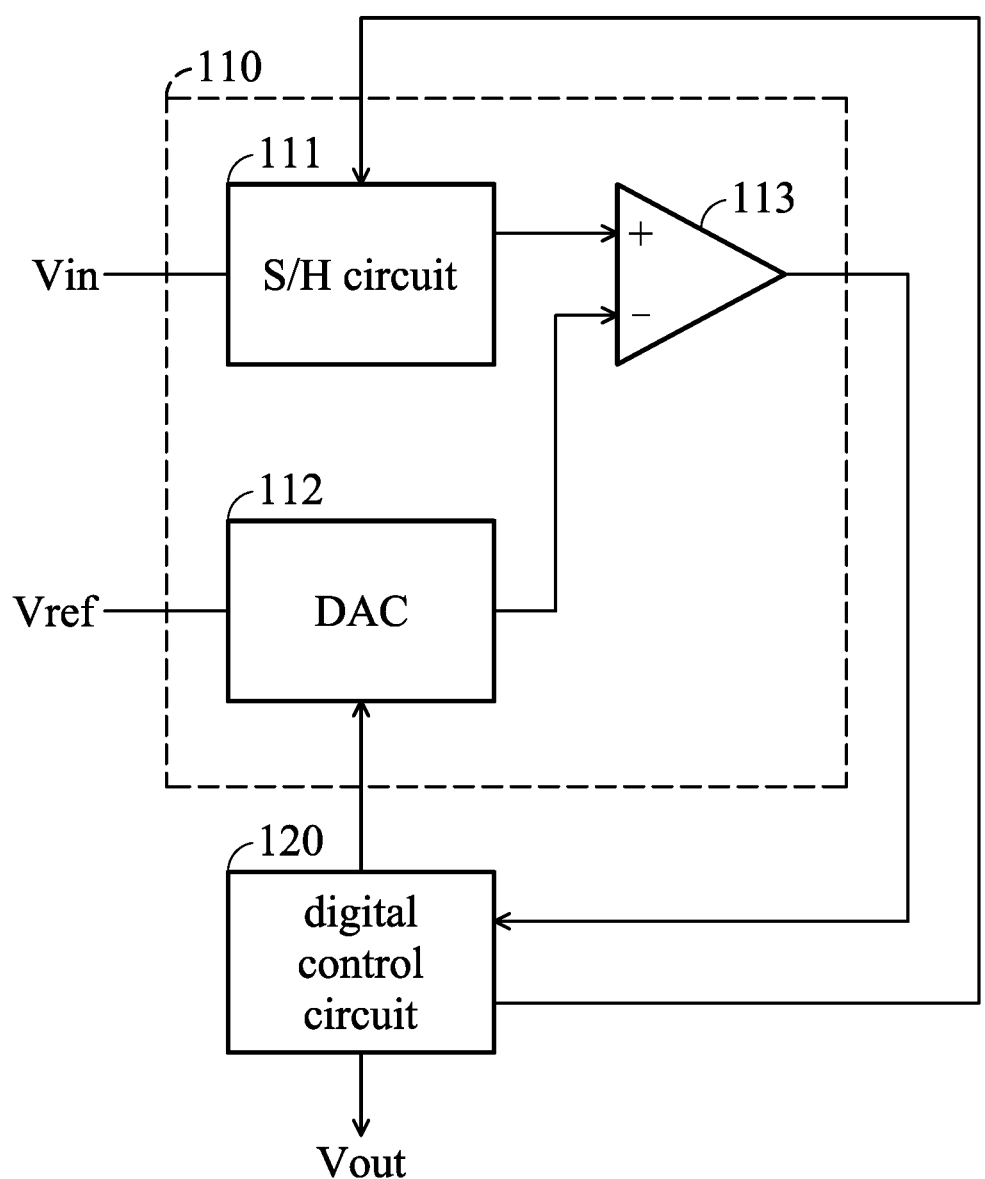
FIG. 1 is a block diagram of a successive-approximation-register (SAR) analog-to-digital converter (ADC) 100 according to an embodiment of the invention.

FIG. 1 is a block diagram of a successive-approximation-register (SAR) analog-to-digital converter (ADC) 100 according to an embodiment of the invention. As shown in FIG. 1, the SAR ADC 100 may comprise an analog circuit 110 and a digital control circuit 120. It should be noted that in order to clarify the concept of the invention, FIG. 1 presents a simplified block diagram in which only the elements relevant to the invention are shown. However, the invention should not be limited to what is shown in FIG. 1. The SAR ADC 100 may comprise other elements.

As shown in FIG. 1, the analog circuit 110 may comprise a sample and hold (S/H) circuit 111, a digital-to-analog convertor (DAC) 112 and a comparator 113. The S/H circuit may be coupled to the digital control circuit 120 and receive the input data Vin. The DAC 112 may be coupled to the digital control circuit 120 and receive the reference data Vref. The comparator 113 may be coupled to the S/H circuit and the DAC 112. Furthermore, the digital control circuit 120 may generate the output data Vout.

Figure 2:
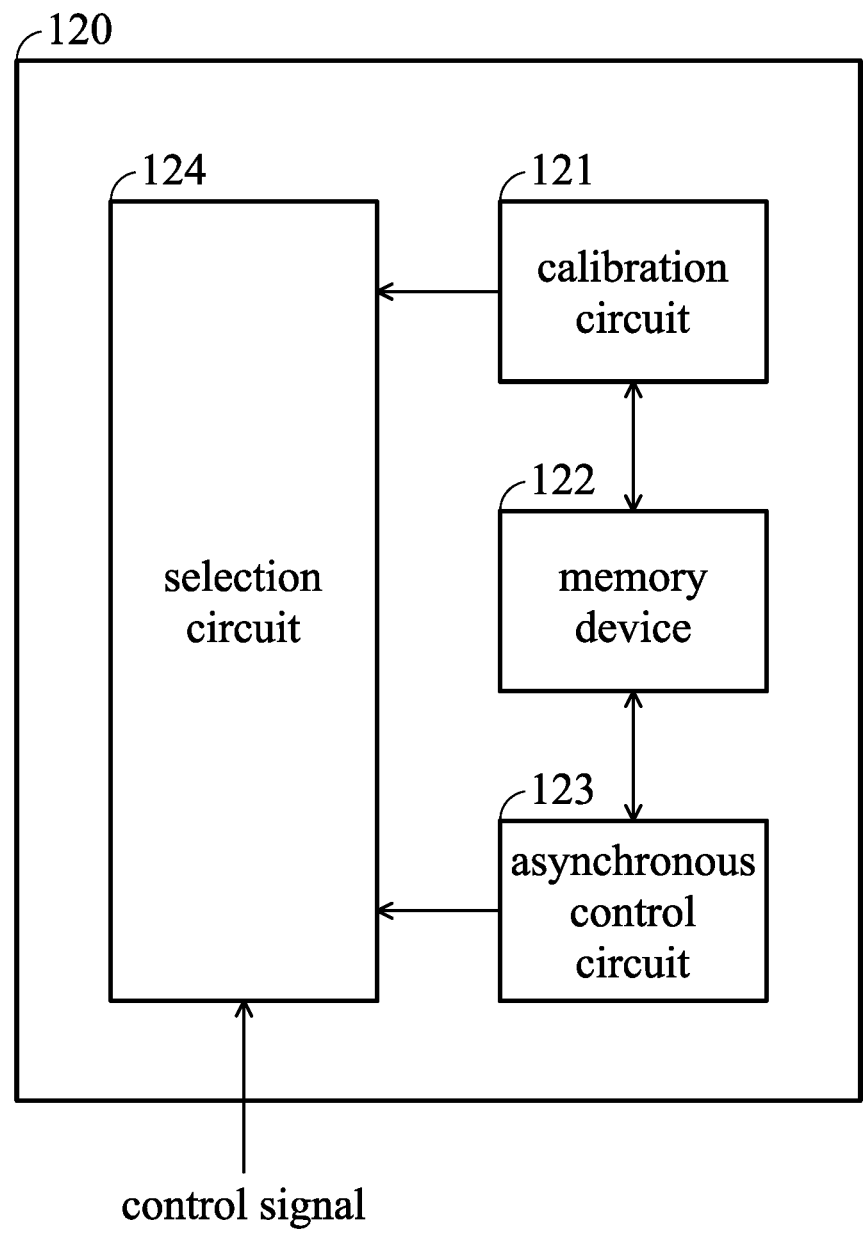
FIG. 2 is a block diagram of a digital control circuit 120 according to an embodiment of the invention.

FIG. 2 is a block diagram of a digital control circuit 120 according to an embodiment of the invention. As shown in FIG. 2, the digital control circuit 120 may comprise a calibration circuit 121, a memory device 122, an asynchronous control circuit 123 and a selection circuit 124. The memory device 122 may be coupled to the calibration circuit 121 and the asynchronous control circuit 123. The selection circuit 124 may be coupled to the analog circuit 110, calibration circuit 121 and the asynchronous control circuit 123.

According to the embodiments of the invention, the calibration circuit 121 may be a synchronous control circuit. It should be noted that the calibration circuit 121 can be any appropriate synchronous control circuit for the SAR ADC 100. For example, the calibration circuit 121 may comprise a SAR control circuit and a SAR register.

According to an embodiment of the invention, the memory device 122 may be a volatile memory device, e.g. a dynamic random access memory (DRAM), but the invention should not be limited thereto. According to another embodiment of the invention, the memory device 122 may be a nonvolatile memory device, e.g. a read only memory (ROM) or a flash memory, but the invention should not be limited thereto.

According to an embodiment of the invention, the selection circuit 124 may be a multiplexer (MUX) circuit, but the invention should not be limited thereto.

According to an embodiment of the invention, before the SAR ADC 100 is applied, the SAR ADC 100 may enter a calibration mode. In the calibration mode, the SAR ADC 100 may generate calibration information through the calibration circuit 121 and store the calibration information in the memory device 122. Specifically, during the process of generating the calibration information, a predefined signal may be inputted to the SAR ADC 100 first. Then the selection circuit 124 may select the calibration circuit 121 (e.g. a synchronous control circuit) to perform the calibration. When the SAR ADC 100 has entered the calibration mode, the SAR ADC 100 may perform the calibration through its calibration circuit 121 (synchronous control circuit) to generate the calibration information and the SAR ADC 100 may store the calibration information in the memory device 122. When the SAR ADC 100 is in practical application, the SAR ADC 100 may use the calibration information stored in the memory device 122 to remove its non-idea effects, e.g. the mismatch of the DAC 112 and the offset voltage of the comparator 113.

According to an embodiment of the invention, the calibration information is generated before the SAR ADC 100 leaves the factory. That is to say, before the SAR ADC 100 leaves the factory, the SAR ADC 100 may need to enter the calibration mode to generate the calibration information and store the calibration information in the memory device 122. When the SAR ADC 100 has left the factory and is in practical application, the SAR ADC 100 will be able to read the calibration information from the memory device 122 and remove its non-idea effects according to the calibration information.

According to an embodiment of the invention, according to an external control signal, the selection circuit 124 may select the synchronous control circuit (i.e. the calibration circuit 121) or the asynchronous control circuit 123 to perform the operations of the SAR ADC 100. According to an embodiment of the invention, the selection circuit 124 may be coupled to a control pin (not shown in figures) and receive the external control signal from the control pin.

According to an embodiment of the invention, when the selection circuit 124 selects the calibration circuit 121 (synchronous control circuit) according to the external control signal, the SAR ADC 100 may be operated in a synchronous mode. That is to say, when the selection circuit 124 selects the calibration circuit 121 (synchronous control circuit) according to the external control signal, the SAR ADC 100 may be regarded as a synchronous SAR ADC. Before the SAR ADC 100 starts to perform the operation in the synchronous mode, the synchronous control circuit (i.e. the calibration circuit 121) may read the calibration information stored in the memory device 122 and then remove the non-idea effects of the SAR ADC 100 according to the calibration information. When the SAR ADC 100 has been calibrated, the SAR ADC 100 will perform the operations through the synchronous control circuit (i.e. the calibration circuit 121) in the synchronous mode.

According to an embodiment of the invention, when the selection circuit 124 selects the asynchronous control circuit 123, the SAR ADC 100 may be operated in an asynchronous mode. That is to say, when the selection circuit 124 selects the asynchronous control circuit 123 according to the external control signal, the SAR ADC 100 may be regarded as an asynchronous SAR ADC. Before the SAR ADC 100 starts to perform the operation in the asynchronous mode, the asynchronous control circuit 123 may read the calibration information stored in the memory device 122 and then remove the non-idea effects of the SAR ADC 100 according to the calibration information. When the SAR ADC 100 has been calibrated, the SAR ADC 100 will perform the operations through the asynchronous control circuit 123 in the asynchronous mode.

Figure 3:
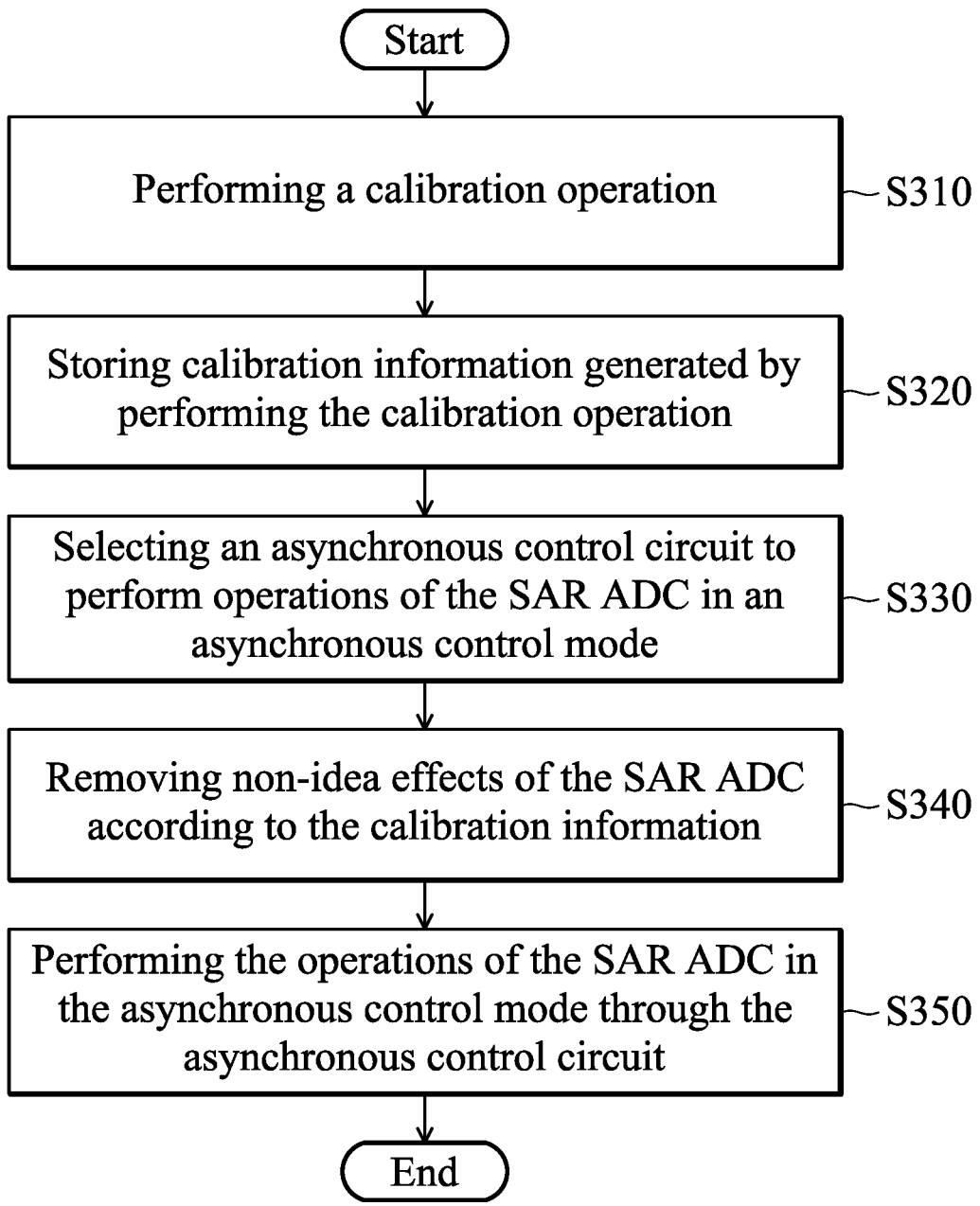
FIG. 3 is a flow chart 300 illustrating a calibration method according to an embodiment of the invention.

FIG. 3 is a flow chart 300 illustrating a calibration method according to an embodiment of the invention. The calibration method is applied to the SAR ADC 100 of the invention. As shown in FIG. 3, in step S310, a calibration circuit of the SAR ADC 100 may perform a calibration operation (i.e. a synchronous mode is selected). In step S320, the calibration information generated by performing the calibration operation is stored in a memory device of the SAR ADC 100. In step S330, an asynchronous control circuit of the SAR ADC 100 is selected to perform the operations of the SAR ADC 100. In step S340, according to the calibration information, the non-idea effects of the SAR ADC 100 are removed through the asynchronous control circuit of the SAR ADC 100. In step S350, the SAR ADC 100 is operated in an asynchronous mode through the asynchronous control circuit of the SAR ADC 100.

According to an embodiment of the invention, the calibration method may comprise that according to an external signal, the selection circuit of the SAR ADC 100 may select the calibration circuit or the asynchronous control circuit to perform the operations of the SAR ADC 100. According to an embodiment of the invention, before the calibration operation, the calibration circuit may be selected to calibrate the SAR ADC 100 to generate the calibration information.

According to an embodiment of the invention, in the calibration method, the calibration circuit may be a synchronous control circuit. When the synchronous control circuit is selected, the SAR ADC 100 may be operated in a synchronous mode. When the asynchronous control circuit is selected, the SAR ADC 100 may be operated in an asynchronous mode.

According to the SAR ADC provided in the embodiments of the invention, the SAR ADC can be calibrated in a synchronous mode and store the calibration information in advance. Therefore, when the SAR ADC is operated in an asynchronous mode, the SAR ADC can remove its non-idea effects according to the calibration information. Therefore, in the SAR ADC provided in the embodiments of the invention, the worse product characteristics and the worse yield rate can be reduced, when the SAR ADC is operated in an asynchronous mode (i.e. the SAR ADC is regarded as an asynchronous SAR ADC).

Use of ordinal terms such as "first", "second", "third", etc., in the disclosure and claims is for description. It does not by itself connote any order or relationship.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A successive-approximation-register (SAR) analog-to-digital converter (ADC), comprising:
    an analog circuit; and
    a digital control circuit, coupled to the analog circuit, wherein the digital control circuit comprises:
    a calibration circuit, configured to perform a calibration operation;
    a memory device, coupled to the calibration circuit and storing calibration information generated by performing the calibration operation; and
    an asynchronous control circuit, coupled to the memory device, and reading the calibration information from the memory device in an asynchronous control mode,
    wherein in the asynchronous control mode, before the asynchronous control circuit performs the operations of the SAR ADC, the asynchronous control circuit removes non-idea effects of the SAR ADC according to the calibration information.

2. The SAR ADC of claim 1, wherein the digital control circuit further comprises:
    a selection circuit, coupled to the calibration circuit and the asynchronous control circuit, and selecting the calibration circuit or the asynchronous control circuit to perform the operations of the SAR ADC according to a control signal.

3. The SAR ADC of claim 2, wherein the selection circuit receives the control signal from a control pin.

4. The SAR ADC of claim 2, wherein before the calibration operation is performed, the selection circuit selects the calibration circuit to calibrate the SAR ADC to generate the calibration information.

5. The SAR ADC of claim 2, wherein the calibration circuit is an asynchronous control circuit.

6. The SAR ADC of claim 1, wherein the analog circuit comprises:
    a sample and hold (S/H) circuit, coupled to the digital control circuit;
    a digital-to-analog convertor (DAC), coupled to the digital control circuit; and
    a comparator, coupled to the S/H circuit and the DAC.

7. A successive-approximation-register (SAR) analog-to-digital converter (ADC), comprising:
    an analog circuit, configured to receive an input signal; and
    a digital control circuit, coupled to the analog circuit, wherein the digital control circuit comprises:
    a calibration circuit, configured to perform a calibration operation;
    a memory device, coupled to the calibration circuit and storing calibration information generated by performing the calibration operation; and
    an asynchronous control circuit, coupled to the memory device, wherein when the SAR ADC performs the operation in an asynchronous control mode, the asynchronous control circuit is selected and outputs an output signal;
    wherein when the asynchronous control circuit is selected, before the asynchronous control circuit performs the operations of the SAR ADC in the asynchronous control mode, the asynchronous control circuit reads the calibration information from the memory device and removes non-idea effects of the SAR ADC according to the calibration information.

8. The SAR ADC of claim 7, wherein the digital control circuit further comprises:
    a selection circuit, coupled to analog circuit, the calibration circuit and the asynchronous control circuit, and selecting the calibration circuit or the asynchronous control circuit to perform the operations of the SAR ADC according to a control signal.

9. A calibration method, applied to a successive-approximation-register (SAR) analog-to-digital converter (ADC), comprising:
    performing a calibration operation via a calibration circuit of the SAR ADC;
    storing calibration information generated by performing the calibration operation;
    selecting an asynchronous control circuit to perform operations of the SAR ADC in an asynchronous control mode;
    removing non-idea effects of the SAR ADC according to the calibration information by the asynchronous control circuit; and
    performing the operations of the SAR ADC in the asynchronous control mode through the asynchronous control circuit.

10. The calibration method of claim 9, further comprising:
    storing the calibration information in a memory device of the SAR ADC.

11. The calibration method of claim 10, further comprising:
   reading the calibration information from the memory device.

12. The calibration method of claim 9, further comprising:
   selecting the calibration circuit or the asynchronous control circuit to perform the operations of the SAR ADC according to a control signal.

13. The calibration method of claim 9, further comprising:
   a selecting circuit of the SAR ADC selecting the calibration circuit or the asynchronous control circuit to perform the operations of the SAR ADC according to a control signal.

14. The calibration method of claim 12, further comprising:
   before the calibration operation is performed, selecting the calibration circuit to calibrate the SAR ADC to generate the calibration information.

15. The calibration method of claim 12, wherein the calibration circuit is an asynchronous control circuit.

* * * * *